(12) United States Patent
Isono et al.

(10) Patent No.: US 7,220,347 B2
(45) Date of Patent: May 22, 2007

(54) ELECTROLYTIC COPPER PLATING BATH AND PLATING PROCESS THEREWITH

(75) Inventors: Toshihisa Isono, Hirakata (JP); Shinji Tachibana, Hirakata (JP); Tomohiro Kawase, Hirakata (JP); Naoyuki Omura, Hirakata (JP)

(73) Assignee: C. Uyemura & Co., Ltd., Osaka-shi (JP)

( * ) Notice: Subject to any disclaimer, the term of this patent is extended or adjusted under 35 U.S.C. 154(b) by 3 days.

(21) Appl. No.: 11/181,856

(22) Filed: Jul. 15, 2005

(65) Prior Publication Data

US 2006/0207886 A1    Sep. 21, 2006

(30) Foreign Application Priority Data

Jul. 23, 2004   (JP)  ............................ 2004-215561
Jul. 11, 2005   (JP)  ............................ 2005-201080

(51) Int. Cl.
*C25D 5/02*   (2006.01)
*C25D 3/38*   (2006.01)
*C23C 16/00*  (2006.01)

(52) U.S. Cl. ................. 205/118; 205/123; 205/125; 205/297; 205/298; 106/1.26

(58) Field of Classification Search ............... 205/118, 205/125, 297, 298, 123; 106/1.26
See application file for complete search history.

(56) References Cited

U.S. PATENT DOCUMENTS 3,502,551 A * 3/1970 Todt et al. ............... 205/298
2005/0016858 A1* 1/2005 Barstad et al. ............ 205/104

* cited by examiner

*Primary Examiner*—Edna Wong

(74) *Attorney, Agent, or Firm*—Oblon, Spivak, McClelland, Maier & Neustadt, P.C.

(57) ABSTRACT

An electrolytic copper plating bath used for via-filling plating of blind via-holes formed on a substrate, containing a water-soluble copper salt, sulfuric acid, chloride ions, and a leveler as an additive, wherein the leveler is either one or both of a quaternary polyvinylimidazolium compound represented by the following formula (1) and a copolymer, represented by the following formula (2), of vinylpyrrolidone and a quaternary vinylimidazolium compound:

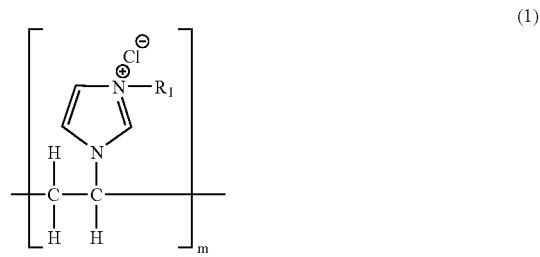

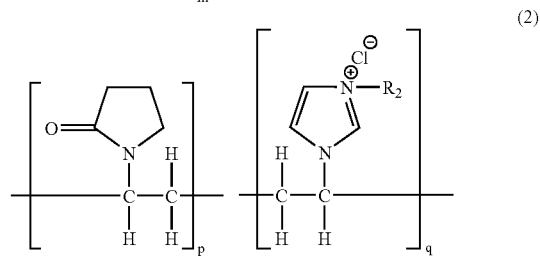

where $R_1$ and $R_2$ are each an alkyl group, m is an integer of not less than 2, and p and q are each an integer of not less than 1, and a copper electroplating method for via-filling plating of blind via-holes formed on a substrate by use of the electrolytic copper plating bath.

20 Claims, 10 Drawing Sheets

○ : LEVELER (DIFFUSION RATE: LOW)

▲ : BRIGHTENER (DIFFUSION RATE: HIGH)

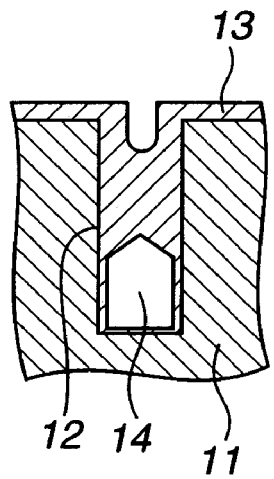
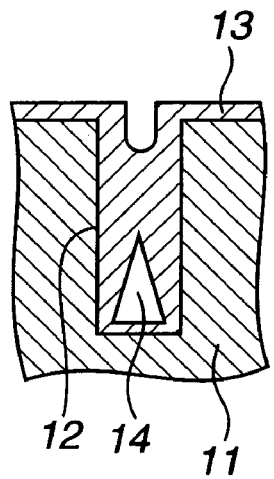
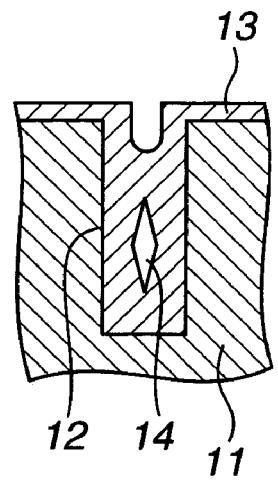
FIG.3A  FIG.3B  FIG.3C
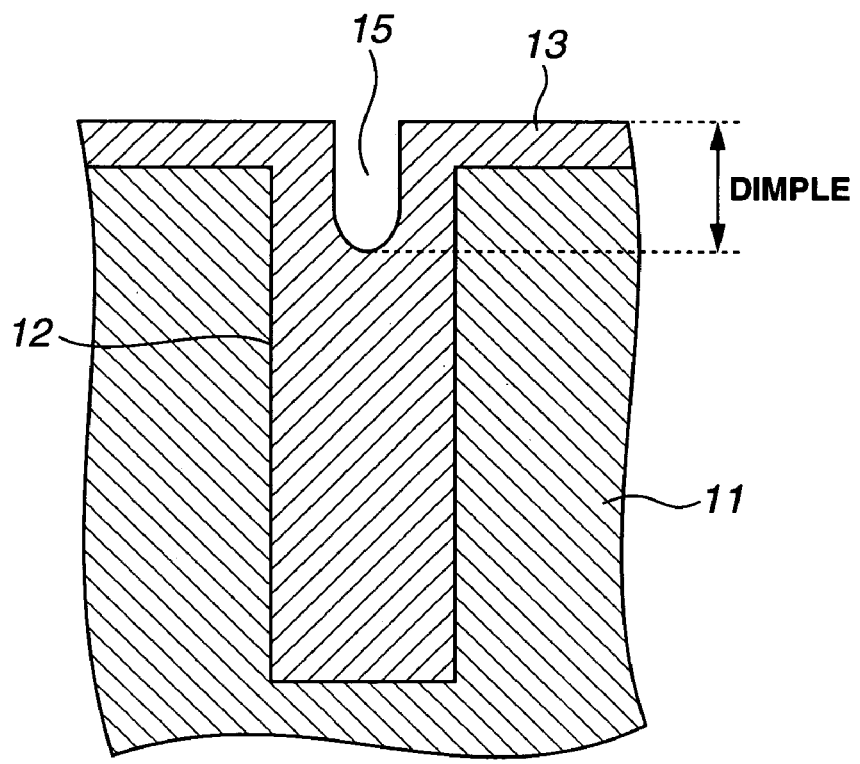
FIG.4

LIQUID FLOW

ELECTROLYTIC COPPER PLATING BATH AND PLATING PROCESS THEREWITH

BACKGROUND OF THE INVENTION

The present invention relates to an electrolytic copper plating bath and a plating process therewith which show excellent filling properties in plating of a substrate having blind via-holes with small diameter and high aspect ratio and which are suitable also for performing via-filling plating and through-hole plating simultaneously for a substrate having both blind via-holes and through-holes.

With the progress of reduction in size of electronic component parts and attendant on the demand for enhanced degrees of integration, the packaging has also been shifting from the peripheral terminal mounting and area terminal mounting toward the three-dimensional mounting. Therefore, in relation to semiconductor chips and interposers, researches of conduction or junction by through-electrodes have been under toward practical use thereof. In the case of the through-electrodes, like in the cases of via-filling for printed circuit boards and copper Damascene process, there is a demand for filling the blind via-holes with a copper plating film by copper electroplating. Besides, in the case of the printed circuit boards, a process for performing via-filling plating and through-hole plating simultaneously has come to be needed.

In a copper sulfate plating bath used for the via-filling plating process, there are used, as additives, a plating accelerator called a brightener which is a sulfur-containing organic substance, and plating suppressors called a carrier which is a polyether compound and a leveler which is a nitrogen-containing compound. In general, the brighteners are comparatively higher in diffusion rate, whereas the carriers and levelers are comparatively lower in diffusion rate. Hitherto, there has been adopted a technique in which a leveler showing a particularly low diffusion rate is used in a copper sulfate plating bath for via-filling, whereby deposition of the plating on the substrate surface side of blind via-holes (the side surface upper end portions of blind via-holes) is suppressed, and the inside of the blind via-holes is filled with the plating.

In such via-filling plating for substrates or boards, the blind via-holes to be filled up have had a large diameter of 50 μm or more and a low aspect ratio of 1 or less; thus, the blind via-holes have been comparatively flat in shape. Attendant on the progress of the degree of integration, however, the blind via-holes to be filled up have come to have a smaller diameter and a higher aspect ratio. Particularly, the blind via-holes for the purpose of forming through-electrodes have a small diameter of several micrometers to several tens of micrometers and a depth of about 100 μm; thus, there is a demand for filling up the blind via-hole with a high aspect ratio by a via-filling plating process. Incidentally, in a copper Damascene process, the absolute value of hole depth has been about 1 μm, though the aspect ratio has been high.

In the cases where the blind via-holes have a smaller aperture diameter or a large depth, the potential difference between the substrate surface side and a bottom portion of the blind via-hole is large, so that the current distribution in the inside of the blind via-hole would be worsened. Therefore, where there is no effect of additive, deposition near the surface is more vigorous than deposition in the bottom portion, so that a cavity is generated, and the blind via-holes cannot be filled up with the copper plating film. In addition, as to the difference in concentration gradient generated by diffusion of the plating solution, i.e., the thickness of the diffusion layer, the difference thereof between the vicinity of the surface and the bottom portion of the blind via-hole is large, with the result of large thickness at the blind via-hole bottom, in the cases where the blind via-holes have a small aperture diameter or a large width. FIG. 1 shows a schematic diagram for illustrating the potential and diffusion layer conditions in via-filling.

The via-filling is performed the difference in diffusion rate between the leveler and the brightener. The leveler is lower than the brightener in diffusion rate, so that the leveler is supplied to the substrate surface and the blind via-hole surface side where the diffusion layer is thinner, thereby suppressing the plating. On the other hand, the supply of the leveler cannot catch up with the supply of the brightener on the blind via-hole bottom side where the diffusion layer is thicker, so that the plating-accelerating effect predominates there. As a result, the plating film preferentially grows starting from the blind via-hole bottom side, whereby the blind via-holes are filled up.

However, in the case of filling up a blind via-hole having a high aspect ratio, the use of a leveler (e.g., Janus green or the like) effective for via-filling plating in the cases of blind via-holes having a low aspect ratio according to the conventional art results in that, since the diffusion rate of the leveler is too low, even a slight thickening of the diffusion layer (toward that on the blind via-hole bottom side) on the substrate surface side of the blind via-holes causes the leveler supply to be insufficient, and a sufficient plating suppression cannot be obtained. Therefore, on the blind via-hole substrate surface side where the potential is higher and the copper ion supply is greater as compared with the blind via-hole bottom side, the plating film grows faster than at the blind via-hole bottom portion, resulting in the formation of a cavity in the vicinity of the blind via-hole bottom portion.

Besides, where simultaneous plating of blind via-holes and through-holes is conducted in a plating solution using a leveler with a low diffusion rate, the blind via-holes can be filled up, but, in the through-hole, the plating suppression of the leveler is concentrated on the through-hole corner area where the diffusion layer is thinnest, with the result of formation of a thinner plating film in this area. This condition, as it is, is accompanied by a considerably bad reliability of conduction; to cope with this problem, therefore, further time and steps would be required, i.e., the plating process may take a longer time, or a treatment for making the substrate conductive may be needed.

SUMMARY OF THE INVENTION

The present invention has been made in consideration of the above-mentioned circumstances. Accordingly, it is an object of the prevent invention to provide an electrolytic copper plating bath and a plating process therewith which show excellent filling properties in plating of a substrate having blind via-holes with small diameter and high aspect ratio and which are suitable also for performing via-filling plating and through-hole plating simultaneously for a substrate having both blind via-holes and through-holes.

The present inventor has made intensive and extensive investigations for solving the above-mentioned problems, and, as a result of the investigations, has found that, when via-filling plating for blind via-holes formed on a substrate is carried out by use of an electrolytic copper plating bath containing a water-soluble copper salt, sulfuric acid, chloride ions, and a leveler as an additive, wherein the leveler is either one or both of a quaternary polyvinylimidazolium compound represented by the following formula (1), and a copolymer, represented by the following formula (2), of a vinylpyrrolidone and a quaternary vinylimidazolium compound:

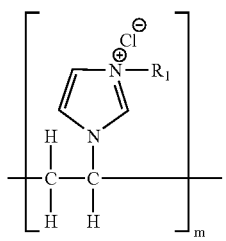
(1)

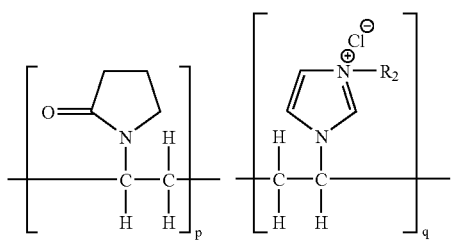
(2)

where $R_1$ and $R_2$ are each an alkyl group, m is an integer of not less than 2, and p and q are each an integer of not less than 1, and preferably, the electrolytic copper plating bath further containing a brightener and/or a carrier wherein the brightener is at least one selected from the group consisting of sulfur-containing additives represented by the following formulas (3) to (6):

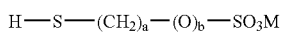
(3)

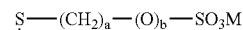
(4)

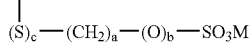
(5)

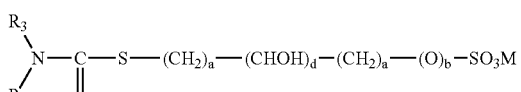

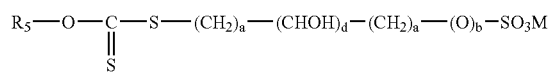
(6)

where $R_3$, $R_4$ and $R_5$ are each an alkyl group of 1 to 5 carbon atoms, M is a hydrogen atom or an alkali metal, a is an integer of 1 to 8, and b, c and d are each 0 or 1; and the carrier is a polyalkylene glycol represented by the following formula (7):

(7)

where $R_6$ is an alkylene group of 2 or 3 carbon atoms, and e is an integer of not less than 4, it is possible to favorably fill up the blind via-holes of a substrate having only the blind via-holes having a small diameter and a high aspect ratio, particularly, a diameter of not less than 1 μm and an aspect ratio [(hole depth)/(hole diameter)] of not less than 2, and that when via-filling plating and through-hole plating for a substrate having both blind via-holes and through-holes are simultaneously performed with the above-mentioned electrolytic copper plating bath, the blind via-holes can be favorably filled up even by an ordinary plating process, the plating film thickness at the through-hole corner portion would not be reduced, and a plating film with excellent adhesion properties can be formed in a comparatively short time.

In a first aspect of the present invention, there is provided an electrolytic copper plating bath used for via-filling plating for a blind via-hole formed on a substrate, containing a water-soluble copper salt, sulfuric acid, chloride ions, and a leveler as an additive, wherein the leveler is either one or both of a quaternary polyvinylimidazolium compound represented by the following formula (1), and a copolymer, represented by the following formula (2), of a vinylpyrrolidone and a quaternary vinylimidazolium compound:

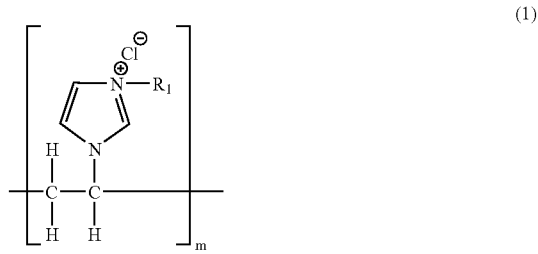
(1)

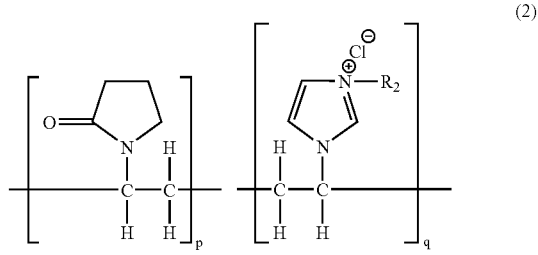
(2)

where $R_1$ and $R_2$ are each an alkyl group, m is an integer of not less than 2, and p and q are each an integer of not less than 1.

In another aspect of the present invention, there is provided a copper electroplating process including the step of performing via-filling plating for a blind via-hole formed on a substrate by use of an electrolytic copper plating bath, the electrolytic copper plating bath containing a water-soluble copper salt, sulfuric acid, chloride ions, and a leveler as an additive, wherein the leveler is either one or both of a quaternary polyvinylimidazolium compound represented by the following formula (1), and a copolymer, represented by the following formula (2), of a vinylpyrrolidone and a quaternary vinylimidazolium compound:

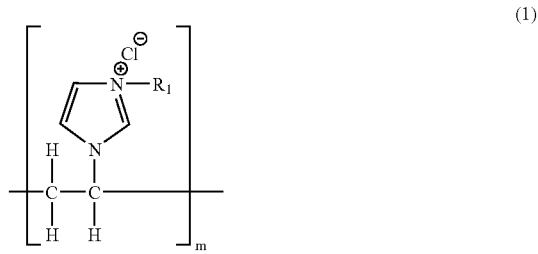
(1)

-continued

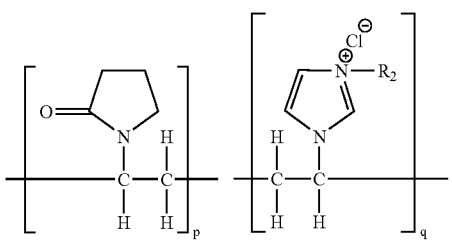
(2)

where $R_1$ and $R_2$ are each an alkyl group, m is an integer of not less than 2, and p and q are each an integer of not less than 1.

The present invention provides excellent filling properties for filling up a blind via-hole having a small diameter and a high aspect ratio, whereby the blind via-holes can be filled up without generating cavity. In addition, the present invention is suitable for application to performing via-filling plating and through-hole plating simultaneously for a substrate having both blind via-holes and through-holes.

BRIEF DESCRIPTION OF THE DRAWINGS

FIG. 3 shows conceptual vertical sectional views of blind via-hole for classifying the shape of a blind via-hole with a cavity generated therein, in Comparative Examples 1 to 5. FIGS. 3A to 3C show the shapes classified into cavity 1 to cavity 3, respectively.

FIG. 4 is an illustration of the dimple on the upper side of a plating formed to fill a blind via-hole, measured in Examples 1 to 6.

FIG. 5A is a vertical sectional view, and FIG. 5B is a bottom view.

DETAILED DESCRIPTION OF THE PREFERRED EMBODIMENTS

Figure 1:
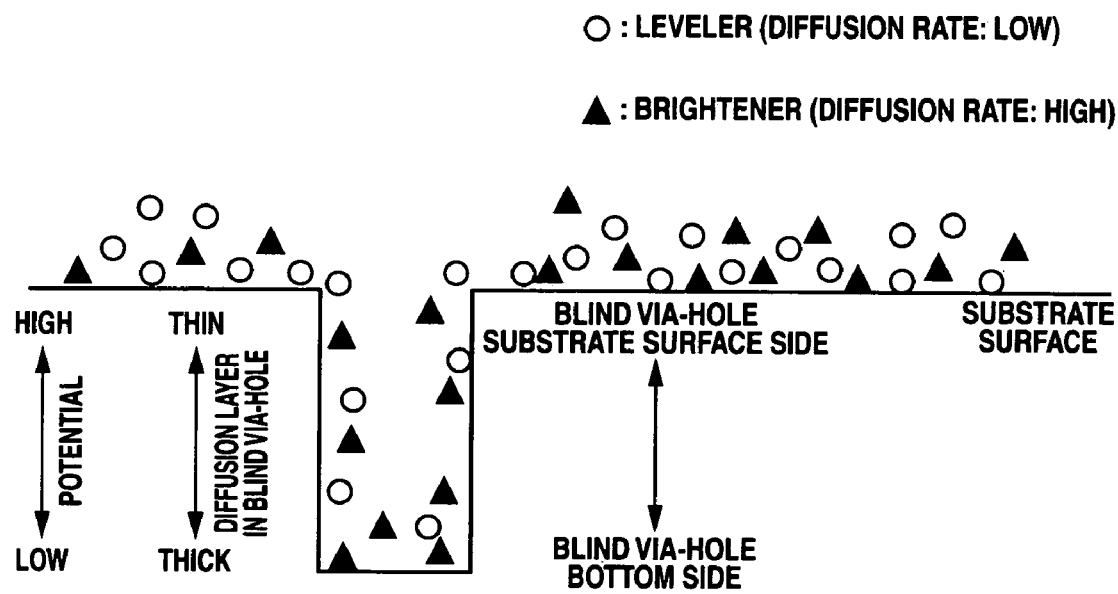
FIG. 1 is a schematic diagram for illustrating the potential and the diffusion layer condition in via-filling.

An electrolytic copper plating bath according to the present invention contains a water-soluble copper salt, sulfuric acid, chloride ions, and a leveler as an additive, wherein the leveler is either one or both of a quaternary polyvinylimidazolium compound represented by the following formula (1) and a copolymer of vinylpyrrolidone and a quaternary vinylimidazolium compound, and the copolymer is represented by the following formula (2):

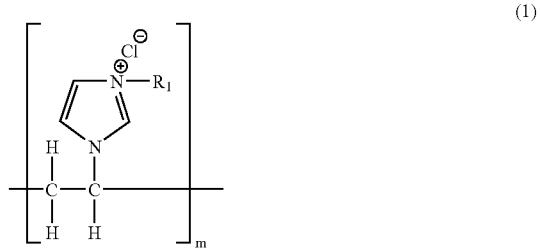
(1)

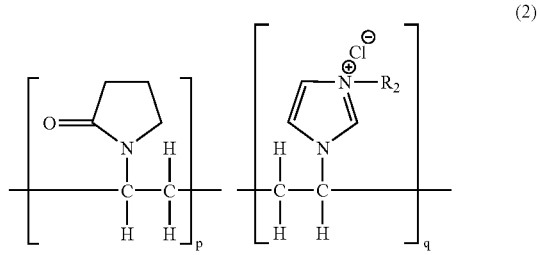
(2)

where $R_1$ and $R_2$ are each an alkyl group, preferably an alkyl group of 1 to 4 carbon atoms, more preferably methyl or ethyl, $R_1$ and $R_2$ may be the same or different, m is an integer of not less than 2, preferably an integer of 10 to 1000, and p and q are each an integer of not less than 1, preferably an integer of 10 to 1000.

The nitrogen-containing compound called leveler functions as a cation in the acidic bath, and is electrically concentrated into electrically high-charged areas, thereby suppressing the deposition of the plating film. The effect of the nitrogen-containing compound can be expected whether it is a tertiary compound or a quaternary compound, but the quaternary compound bearing a positive charge is considered to have a stronger plating suppression.

The quaternary polyvinylimidazolium compound contained in the electrolytic copper plating bath according to the present invention is a polymer of which the main chain is derived from the vinyl group, so that, unlike a monomer, its flexible straight chain moderates the influence of the steric hindrance, smoothly reaches the blind via-hole side surface, and the quaternary compound (cation) of imidazole of the rigid side chain is concentrated in high-charge areas, thereby giving a strong plating suppression as a leveler. Also, the copolymer of vinylpyrrolidone and the quaternary vinylimidazolium compound functions in the same manner.

Therefore, in the present invention using the electrolytic copper plating bath containing either one or both of the quaternary polyvinylimidazolium compound and the copolymer of vinylpyrrolidone and the quaternary vinylimidazolium compound, the diffusion rate of the leveler is higher than those of the levelers according to the conventional art. The diffusion rate is suitable for filling up not only the blind via-holes having a large diameter and a low aspect ratio, which have hitherto been the objects of filling up, but also the blind via-holes having a small diameter and a high aspect ratio, particularly a diameter of not less than 1 μm, preferably 1 to 100 μm, more preferably 5 to 50 μm, and an aspect ratio [(hole depth)/(hole diameter)] of not less than 2, preferably 2 to 10. The leveler is effectively supplied not only to the substrate surface side of blind via-holes (upper end portions of blind via-hole side surfaces) but also to central portions in the vertical direction of the blind via-hole side surfaces, so that the thickening of the plating film at the central portions of the blind via-holes is suppressed. Consequently the plating film grows preferentially from the bottom portions of the blind via-holes, and the blind via-holes can be filled up without generating cavities.

Besides, simultaneous via-filling plating and through-hole plating for a substrate having both blind via-holes and through-holes by use of the plating bath according to the present invention is very effective. As for the hole diameter and the aspect ratio of the blind via-holes of this substrate, which has blind via-holes and through-holes, generally, the hole diameter is greater (not less than 50 μm) and the aspect ratio is lower (not more than 1), i.e., the blind via-holes are comparatively flat in shape, as compared with the blind via-holes of the above-mentioned substrate having only the blind via-holes. It becomes more difficult to fill up blind via-holes as the aspect ratio of the blind via-holes becomes higher. However, the plating solution according to the present invention is effective for filling up blind via-holes with a high aspect ratio, so that the plating solution naturally is effective for filling up the comparatively flat blind via-holes. Further, also in the case of through-holes which are more constant in the thickness of the diffusion layer than blind via-holes, the leveler is supplied to the whole part of the inside of each hole, so that even when through-hole plating is conducted simultaneously with the via-filling by an ordinary plating process, the plating film in the through-hole corner areas would not be thin, and an excellent plating film with a uniform film thickness can be formed in a comparatively short time. In this case, the diameter and the aspect ratio of the blind via-holes to be filled up are not particularly limited, but the plating bath according to the present invention is suitable for plating for a substrate having blind via-holes and through-holes, in which the blind via-holes have a diameter of not less than 1 μm, preferably 10 to 200 μm, more preferably 20 to 100 μm, and an aspect ratio [(hole depth)/(hole diameter)] of not less than 0.3, preferably 0.5 to 1.

Incidentally, the shape of the blind via-holes which are objects to be treated in the present invention is not particularly limited. The aperture shape of the blind via-holes may be circle, ellipse, or polygon such as tetragon. In the case where the aspect ratio is specified, the diameter is the length of the shortest one of the straight lines which pass through the center of gravity of the aperture plane and which connect arbitrary two points on the perimeter of the aperture.

Figure 2:
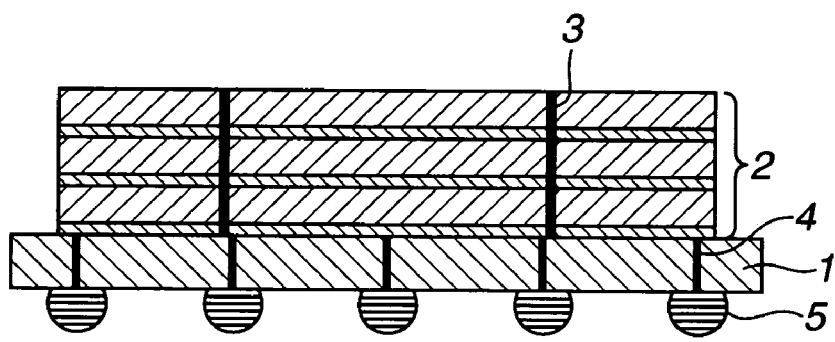
FIG. 2 is a sectional view showing an example of a three-dimensionally mounted package.

In addition, the present invention is suitable for filling up by plating for through electrodes 3, 4 formed in a three-dimensionally mounted package in which a chip 2 is laminated on an interposer 1 formed of silicon or the like as shown in FIG. 2, for example. In FIG. 2, symbol 5 donates a solder ball.

The concentration of the leveler in the electrolytic copper plating bath according to the present invention is preferably 0.01 to 1000 mg/L, particularly 0.1 to 100 mg/L, more particularly 0.1 to 50 mg/L.

On the other hand, in the present invention, the electrolytic copper plating bath contains a water-soluble copper salt, such as copper sulfate, as a source of copper; the concentration of the water-soluble copper salt, for example in the case of copper sulfate, is a concentration corresponding to 30 to 300 g/L as copper sulfate pentahydrate. Besides, the electrolytic copper plating bath according to the present invention contains sulfuric acid and chloride ions. The concentration of sulfuric acid is preferably 30 to 300 g/L, and the concentration of the chloride ions is preferably 5 to 150 mg/L, particularly 20 to 100 mg/L. If the chloride ion concentration exceeds 150 mg/L, copper chloride might be formed on the surface of the anode, leading to passivation of the anode. On the other hand, if the chloride ion concentration is less than 5 mg/L, the plating suppression partially affects, and a stepped plating film is formed.

Furthermore, it is preferable for the electrolytic copper plating bath according to the present invention to contain a brightener as a nucleation accelerator and/or a carrier as a nucleus growth suppressor, for achieving efficient deposition starting from the blind via-hole bottoms. The brightener preferably contains at least one selected from the group consisting of sulfur-containing additives represented by the following formulas (3) to (6):

(3)

$$H-S-(CH_2)_a-(O)_b-SO_3M$$

(4)

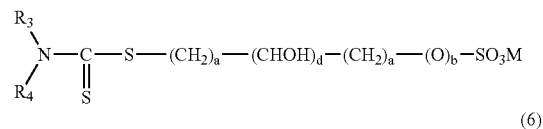

(5)

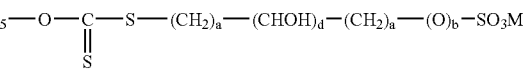

(6)

where $R_3$, $R_4$ and $R_5$ are each an alkyl group of 1 to 5 carbon atoms, preferably methyl or ethyl, $R_3$, $R_4$ and $R_5$ may be the same or different, M is a hydrogen atom or an alkali metal such as sodium and potassium, a is an integer of 1 to 8, preferably 1 to 5, particularly preferably 3, and b, c and d are each 0 or 1.

Specific examples of the brightener include those represented by the following formulas (8) to (11):

  (8)

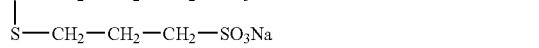  (9)

  (10)

  (11)

On the other hand, the carrier preferably contains a polyalkylene glycol represented by the following formula (7):

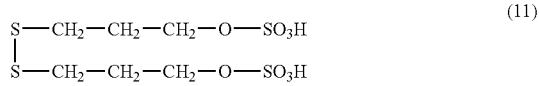  (7)

where $R_6$ is an alkylene group of 2 or 3 carbon atoms (ethylene group or propylene group), the plurality of $R_6$ groups may be the same or different, and e is an integer of not less than 4, preferably 10 to 250.

Incidentally, the alkylene glycol preferably has an average molecular weight (weight average molecular weight) of not less than 200, particularly 500 to 15000.

The sulfur-containing compound used as the brightener has the function, by being accumulated in the inside of the blind via-holes, to accelerate the deposition of the plating metal starting from the bottom surfaces of the blind via-holes. The carrier has the function to increase polarization, by forming a complex with the $Cu^+$ ions and being adsorbed on the copper surface of the cathode, whereby uniform electro-deposition properties are enhanced. In addition, in the presence of chloride ions, the complex interacts with the chloride ions, whereby the uniform electro-deposition properties are further enhanced. In order to form the complex with copper, it is necessary for the carrier to have a certain extent of size (molecular weight). Therefore, the carrier is preferably a polyalkylene glycol, for example, polyethylene glycol, polypropylene glycol, or an ethylene glycol-propylene glycol copolymer, that contains at least four alkylene groups. With the brightener and the carrier used together, the plating film can be formed in a uniform film thickness, and the copper crystals constituting the plating film are made finer, leading to stabilization of the appearance of the plating.

Besides, as the polyalkylene glycol, the ethylene glycol-propylene glycol copolymer is particularly preferred. The polyethylene glycol and polypropylene glycol tend to form reaction by-products when they are used for a long time, it may become difficult to conduct concentration control by CVS (Cyclic Voltammetry Stripping) which is a general analysis and control apparatus for plating bath additives including a water-soluble copper salt such as copper sulfate. On the other hand, the ethylene glycol-propylene glycol copolymer can be used for a long time without generating considerable influences of reaction by-products on the CVS; thus, the copolymer promises easy concentration control, is suited to long-time use, and is therefore preferable.

When the leveler is used together with the brightener and the carrier, by the synergistic effect with the plating-suppression of the leveler on the area ranging from the substrate surface side of blind via-holes (blind via-hole side surface upper end portions) to the central portions in the vertical direction of the blind via-hole side surfaces, the plating film growth from the blind via-hole bottom side proceeds preferentially, whereby the blind via-holes can be securely filled up in a comparatively short time and without generating cavities. Furthermore, the dimple formed in an upper portion of the via-filling plating can be reduced, so that the plating film on the substrate surface (the surface to be plated) can be made thinner. Besides, plating at a high current density is made possible, and a shortening of the operation time can be expected.

The concentration of the brightener in the electrolytic copper plating bath according to the present invention is preferably 0.1 to 100 mg/L, particularly 0.1 to 30 mg/L.

The concentration of the carrier in the electrolytic copper plating bath of the present invention is desirably 0.05 to 2 g/L.

Incidentally, in the electroplating according to the present invention, a known plating process can be applied. Furthermore, a process can be applied in which the actions of a sulfur-containing compound (brightener) and a polyether compound (carrier), contained in a general electrolytic copper plating bath, are not provided in the electrolytic plating bath but given by a pretreatment with a pre-dipping solution, and thereafter electroplating is conducted in an electrolytic copper plating bath containing neither a brightener nor a carrier.

In the present invention, blind via-holes formed on a substrate are filled up by plating with the above-described electrolytic copper plating bath. As the electroplating conditions, conventionally known conditions can be applied. It is preferable to set the cathode current density in the range of 0.05 to 5 A/dm$^2$, particularly 0.5 to 3 A/dm$^2$. In addition, agitation can be effected by a generally used technique, for example, aeration, jet, squeegee or the like.

The anode may be used any of known ones, including soluble anodes, such as steel plate, and insoluble anodes. Besides, the plating temperature can be 15 to 35° C., particularly 22 to 28° C.

EXAMPLES

Examples and Comparative Examples are given below for illustrating the invention although the invention is not limited thereto.

Comparative Example 1

A silicon wafer was provided with blind via-holes having an aperture portion of 50 µm square, a depth of 150 µm and an aspect ratio of 3.0 by etching, and an insulation layer is formed on the inside walls of the blind via-holes. Thereafter, a Cu diffusion barrier layer (TiN) as a plating base coat layer and a seed layer (Cu) for the start of plating are formed on the wafer. The wafer was plated for via-filling by use of an electrolytic copper plating bath containing 200 g/L of copper sulfate pentahydrate, 50 g/L of sulfuric acid, 50 mg/L of chloride ions, 2 mg/L of SPS [bis-(3-sodiumsulfopropyl) disulfide] as a brightener, 200 mg/L of PO-EO [ethylene glycol-propylene glycol copolymer (average molecular weight: 1500)] as a carrier, and 5 mg/L of JG. B [Janus green black] as a leveler, under the conditions of CD=0.5 A/dm$^2$ and a plating time of 180 min.

Next, for evaluating the plating-filled state of the blind via-hole, the blind via-hole was cut off, the section was polished to mirror surface, and the presence or absence of cavity was observed. For the blind via-holes having cavities generated therein, the sectional shapes of the cavities were classified into three shapes shown in FIGS. 3A to 3C. Incidentally, in Table 1, cavity 1 is that classified into the shape shown in FIG. 3A, cavity 2 is that classified into the shape shown in FIG. 3B, and cavity 3 is that classified into the shape shown in FIG. 3C. In FIG. 3, symbol 11 denotes a silicon wafer, 12 denotes a blind via-hole, 13 denotes copper (plating film), and 14 denotes a cavity.

On the other hand, for the blind via-holes not having any cavity generated therein, the dimple formed in an upper portion of the blind via-hole was measured. Incidentally, the depth of the dimple is shown in FIG. 4, in which symbol 11 denotes a silicon wafer, 12 denotes a blind via-hole, 13 denotes copper (plating film), and 15 denotes a dimple. The results are shown in Table 1.

Comparative Example 2

Via-filling plating was conducted in the same manner as in Comparative Example 1, except that 1-hydroxyethyl-2-alkylimidazoline chloride was used as the leveler, and the plating-filled state of the blind via-holes was evaluated. The results are given in Table 1.

Comparative Example 3

Via-filling plating was carried out in the same manner as in Comparative Example 1, except that PVP [polyvinylpyrrolidone (average molecular weight: 40000); VP (vinylpyrrolidone):VI (vinylimidazole)=100:0] was used as the leveler, and the plating-filled state of the blind via-holes was evaluated. The results are shown in Table 1.

Comparative Example 4

Via-filling plating was performed in the same manner as in Comparative Example 1, except that PVI [polyvinylimidazole (average molecular weight: about 60000); VP (vinylpyrrolidone):VI (vinylimidazole)=0:100] was used as the leveler, and the plating-filled state of the blind via-holes was evaluated. The results are given in Table 1.

Comparative Example 5

Via-filling plating was carried out in the same manner as in Comparative Example 1, except that a reaction product of benzyl chloride and polyethyleneimine was used as the leveler, and the plating-filled state of the blind via-holes was evaluated. The results are given in Table 1.

Example 1

A silicon wafer was provided with blind via-holes having an aperture portion of 50 μm square, a depth of 150 μm and an aspect ratio of 3.0 by etching, and an insulation layer was formed on the inside walls of the blind via-holes. Then, a Cu diffusion barrier layer (TiN) as a plating base coat layer and a seed layer (Cu) for the start of plating were formed on the wafer. The wafer was plated for via-filling by use of an electrolytic copper plating bath containing 200 g/L of copper sulfate pentahydrate, 50 g/L of sulfuric acid, 50 mg/L of chloride ions, 2 mg/L of SPS [bis-(3-sodiumsulfopropyl) disulfide] as a brightener, 500 mg/L of PEG [polyethylene glycol (average molecular weight: 7500)] as a carrier, and 5 mg/L of a copolymer of vinylpyrrolidone (VP) and vinylimidazolium chloride (VICl) (average molecular weight: about 60000 (corresponding to p=20 and q=400 in the above formula (2)); VP:VICl=5:95 (mol ratio)) as a leveler, under the conditions of CD=0.5 A/dm$^2$ and a plating time of 180 min.

Next, the plating-filled state of the blind via-holes was evaluated by the same method as in Comparative Example 1. The results are shown in Table 1.

Example 2

A silicon wafer was provided with blind via-holes having an aperture portion of 50 μm square, a depth of 150 μm and an aspect ratio of 3.0 by etching, and an insulation layer was formed on the inside walls of the blind via-holes. Thereafter, a Cu diffusion barrier layer (TiN) as a plating base coat layer and a seed layer (Cu) for the start of plating were formed on the wafer. The wafer was plated for via-filling by use of an electrolytic copper plating bath containing 50 g/L of copper sulfate pentahydrate, 100 g/L of sulfuric acid, 70 mg/L of chloride ions, 15 mg/L of DDPS [sodium N,N-dimethyldithiocarbamylpropylsulfonate] as a brightener, 50 mg/L of PEG [polyethylene glycol (average molecular weight: 7500)] as a carrier, and 5 mg/L of a copolymer of vinylpyrolidone (VP) and vinylimidazolium chloride (VICl) (average molecular weight: 60000 (corresponding to p=20 and q=400 in the above formula (2)); VP:VICl=5:95 (mol ratio)) as a leveler, under the conditions of CD=0.5 A/dm$^2$ and a plating time of 180 min.

Next, the plating-filled state of the blind via-holes was evaluated by the same method as in Comparative Example 1. The results are given in Table 1.

Example 3

A silicon wafer was provided with blind via-holes having an aperture portion of 50 μm square, a depth of 150 μm and an aspect ratio of 3.0 by etching, and an insulation layer is formed on the inside walls of the blind via-holes. Thereafter, a Cu diffusion barrier layer (TiN) as a plating base coat layer and a seed layer (Cu) for the start of plating were formed on the wafer. The wafer was plated for via-filling by use of an electrolytic copper plating bath containing 250 g/L of copper sulfate pentahydrate, 40 g/L of sulfuric acid, 150 mg/L of chloride ions, 0.1 mg/L of OES [O-ethyl-S-(3-propylsulfonic acid-1)dithiocarbonate potassium salt] as a brightener, 200 mg/L of PO-EO [ethylene glycol-propylene glycol copolymer (average molecular weight: 1500)] as a carrier, and 5 mg/L of PVICl [polyvinylimidazolium chloride (average molecular weight: about 60000 (corresponding to m=400 in the above formula (1)))] as a leveler, under the conditions of CD=0.5 A/dm$^2$ and a plating time of 180 min.

Next, the plating-filled state of the blind via-holes was evaluated by the same method as in Comparative Example 1. The results are given in Table 1.

Example 4

A silicon wafer was provided with blind via-holes having an aperture portion of 50 μm square, a depth of 150 μm and an aspect ratio of 3.0 by etching, and an insulation layer was formed on the inside walls of the blind via-holes. Thereafter, a Cu diffusion barrier layer (TiN) as a plating base coat layer and a seed layer (Cu) for the start of plating were formed on the wafer. The wafer was plated for via-filling plating by use of an electrolytic copper plating bath containing 100 g/L of copper sulfate pentahydrate, 250 g/L of sulfuric acid, 20 mg/L of chloride ions, 2 mg/L of SPS [bis-(3-sodiumsulfopropyl) disulfide] as a brightener, 2000 mg/L of PO-EO [ethylene glycol-propylene glycol copolymer (average molecular weight: 1500)] as a carrier, and 1 mg/L of PVICl [polyvinylimidazolium chloride (average molecular weight: about 60000 (corresponding to m=400 in the above formula (1)))] as a leveler, under the conditions of CD=1 A/dm$^2$ and a plating time of 90 min.

Next, the plating-filled state of the blind via-holes was evaluated by the same method as in Comparative Example 1. The results are shown in Table 1.

Example 5

A silicon wafer was provided with blind via-holes having an aperture portion of 50 μm square, a depth of 150 μm and an aspect ratio of 3.0 by etching, and an insulation layer was formed on the inside walls of the blind via-holes. Thereafter, a Cu diffusion barrier layer (TiN) as a plating base coat layer and a seed layer (Cu) for the start of plating were formed on the wafer. The wafer was plated for via-filling by use of an electrolytic copper plating bath containing 200 g/L of copper sulfate pentehydrate, 50 g/L of sulfuric acid, 50 mg/L of chloride ions, 2 mg/L of SPS [bis-(3-sodiumsulfopropyl) disulfide] as a brightener, 50 mg/L of PO-EO [ethylene glycol-propylene glycol copolymer (average molecular weight: 1500)] as a carrier, and 100 mg/L of a copolymer of vinylpyrrolidone (VP) and vinylimidazolium chloride (VICl) (average molecular weight: about 100000 (corresponding to p=400 and q=400 in the above formula (2)); VP:VICl=50:50 (mol ratio)) as a leveler, under the conditions of CD=1.5 A/dm$^2$ and a plating time of 60 min.

Next, the plating-filled state of the blind via-holes was evaluated by the same method as in Comparative Example 1. The results are given in Table 1.

Example 6

A silicon wafer was provided with blind via-holes having an aperture portion of 50 μm square, a depth of 150 μm and an aspect ratio of 3.0 by etching, and an insulation layer was formed on the inside walls of the blind via-holes. Thereafter, a Cu diffusion barrier layer (TiN) as a plating base coat layer and a seed layer (Cu) for the start of plating were formed on the wafer. The wafer was plated for via-filling by use of an electrolytic copper plating bath containing 200 g/L of copper sulfate pentahydrate, 50 g/L of sulfuric acid, 50 mg/L of chloride ions, 5 mg/L of DDPS [sodium N,N-dimethyldithiocarbamylpropylsulfonate] as a brightener, 1000 mg/L of PO-EO [ethylene glycol-propylene glycol copolymer (average molecular weight: 1500)] as a carrier, and 0.01 mg/L of a copolymer of vinylpyrrolidone (VP) and vinylimidazolium chloride (VICl) (average molecular weight: about 60000 (corresponding to p=20 and q=400 in the above formula (2)); VP:VICl=5:95 (mol ratio)) as a leveler, under the conditions of CD=2 A/dm$^2$ and a plating time of 45 min.

Next, the plating-filled state of the blind via-holes was evaluated by the same method as in Comparative Example 1. The results are shown in Table 1.

TABLE 1

| | Results of evaluation Blind via-holes (50 μm square – d150 μm) | |
|---|---|---|
| | Cavity | Dimple (μm) |
| Comparative Example 1 | Cavity 1 | — |
| Comparative Example 2 | Cavity 1 | — |
| Comparative Example 3 | Cavity 3 | — |
| Comparative Example 4 | Cavity 2 | — |
| Comparative Example 5 | Cavity 2 | — |
| Example 1 | none | 8 |
| Example 2 | none | 10 |
| Example 3 | none | 9 |
| Example 4 | none | 15 |
| Example 5 | none | 13 |
| Example 6 | none | 17 |

Evaluation of Electroplating Characteristics by Cathode Polarization Measurement Using Rotating Electrode Furthermore, the plating solutions used in Comparative Example 1, Comparative Example 4, Comparative Example 3, Example 1, Example 3 and Example 5 were evaluated their electrochemical characteristics by cathode polarization measurement using a rotating electrode. In this measurement, an electrode is rotated at a fixed speed to generate a liquid flow, whereby mass transfer according to the rotating speed is induced on the electrode surface, and the mass transfer rates in the inside and the outside of blind via-hole were measured in a simulated manner.

Figure 5A:
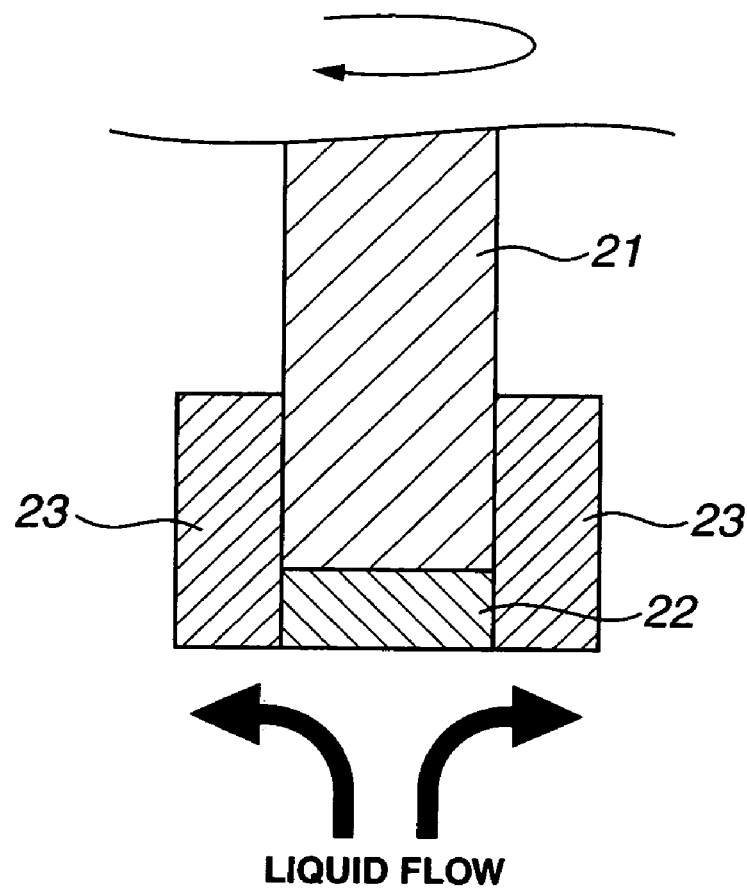
FIGS. 5A and 5B show illustration of a rotating electrode used in polarization measurement and the operation thereof.
Figure 5B:
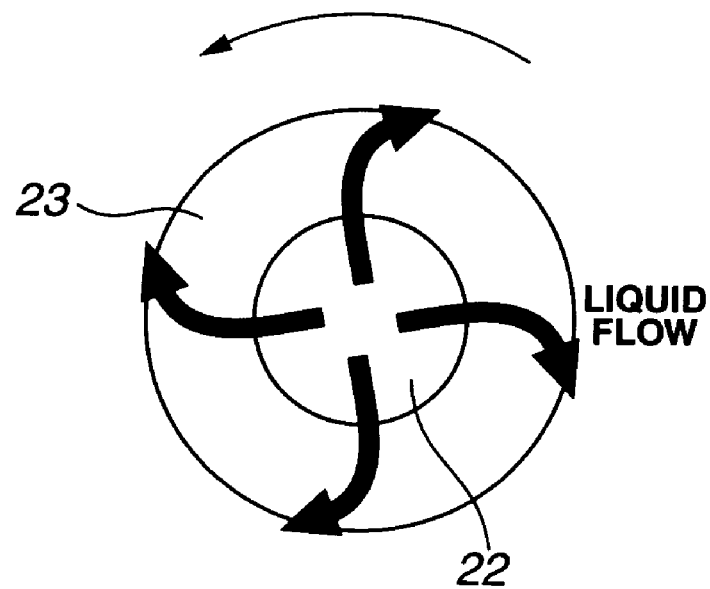

First, by use of a rotating electrode (platinum 22 portion had a diameter of 0.5 mmΦ) shown in FIG. 5, current potential curve (polarization curve) was measured in each of the plating baths at rotating speeds of 0, 25, 50, 500 and 1000 rpm, respectively. The variation in the rotating speeds causes variations in the thickness of the diffusion layer on the surface of the rotating electrode. By measuring the polarization curve, it is possible to achieve relative evaluations for from blind via-hole bottom portion, through blind via-hole wall surface, to blind via-hole upper portion and blind via-hole outside. In FIG. 5, symbol 21 denotes a core shaft, and 23 denotes an insulating resin.

Figure 6:
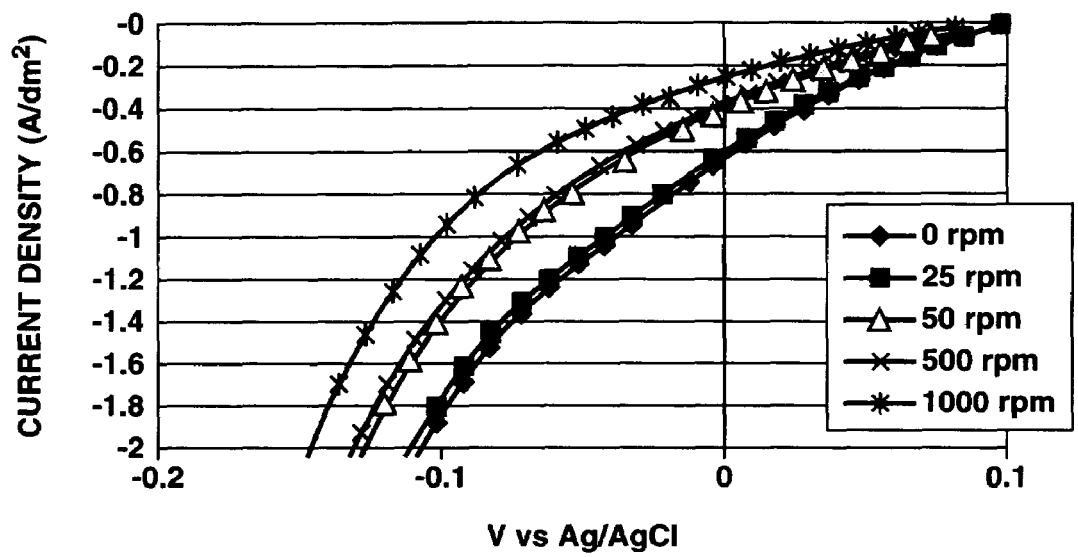
FIG. 6 shows polarization curves obtained by the polarization measurement for an electrolytic plating bath of Comparative Example 1.
Figure 7:
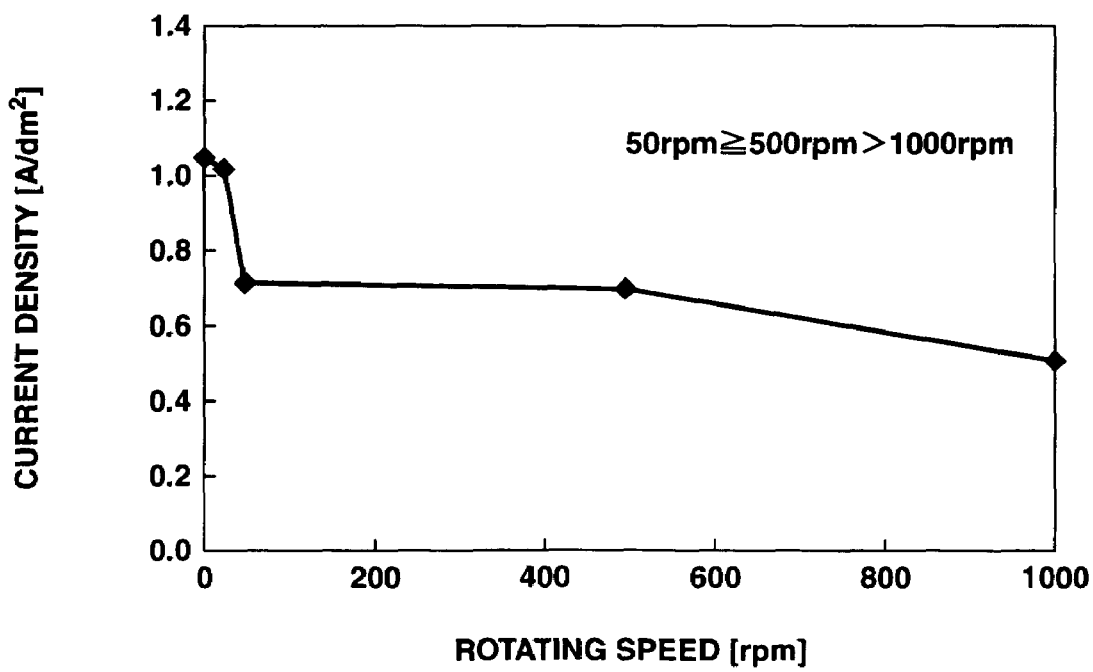
FIG. 7 shows a graph obtained by plotting the current density at a potential of –0.050 V, in the polarization curves at each rotating speeds shown in FIG. 6.
Figure 8:
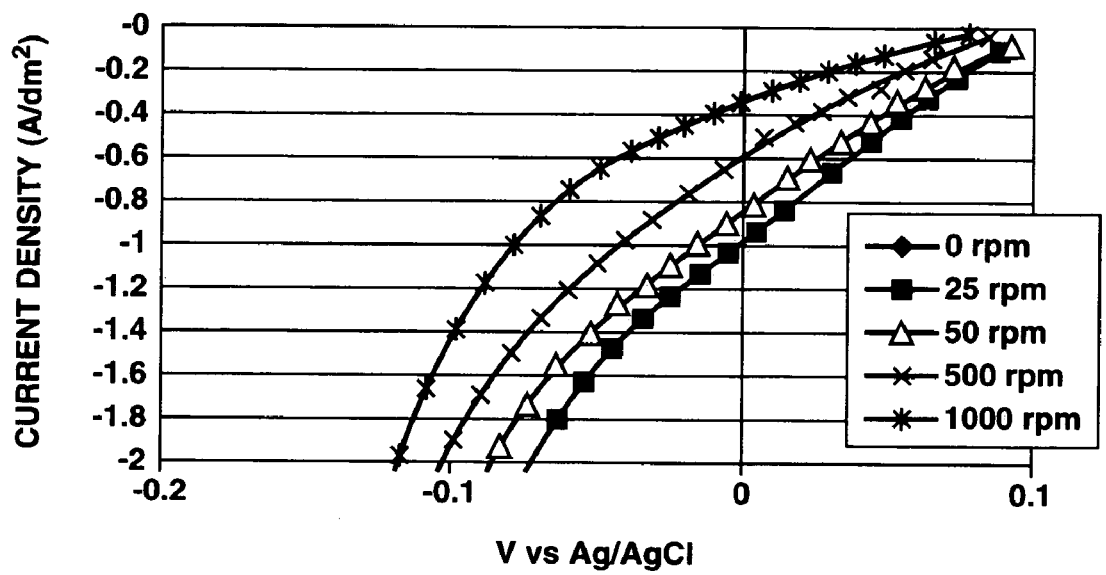
FIG. 8 shows polarization curves obtained by the polarization measurement for an electrolytic plating bath of Comparative Example 4.
Figure 9:
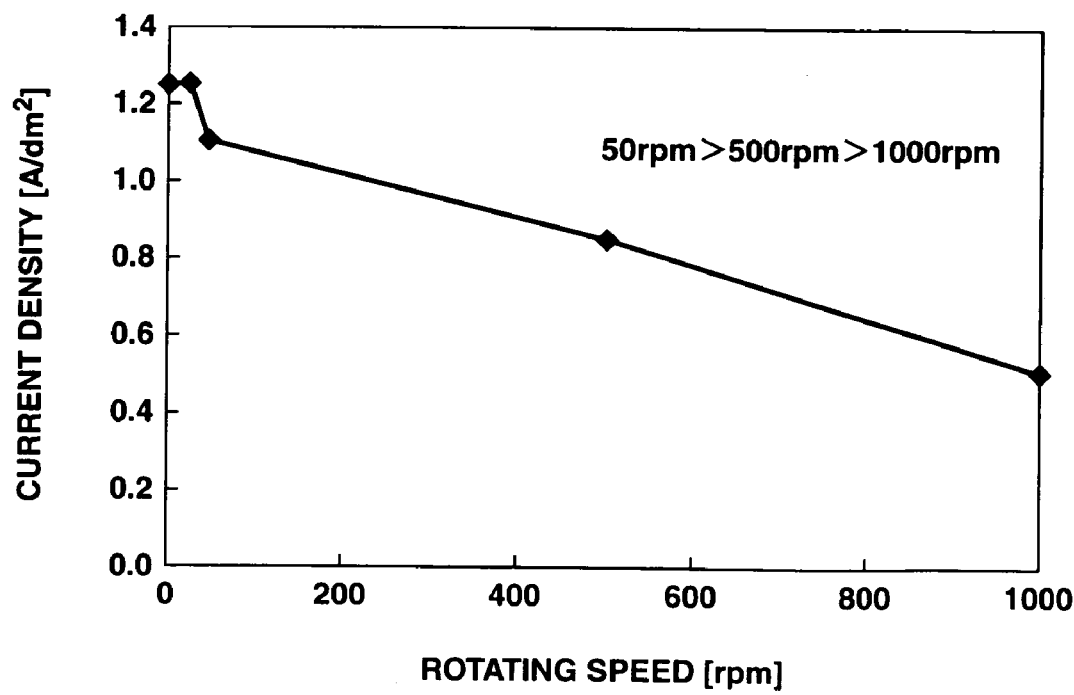
FIG. 9 shows a graph obtained by plotting the current density at a potential of –0.028 V, in the polarization curves at each rotating speeds shown in FIG. 8.
Figure 10:
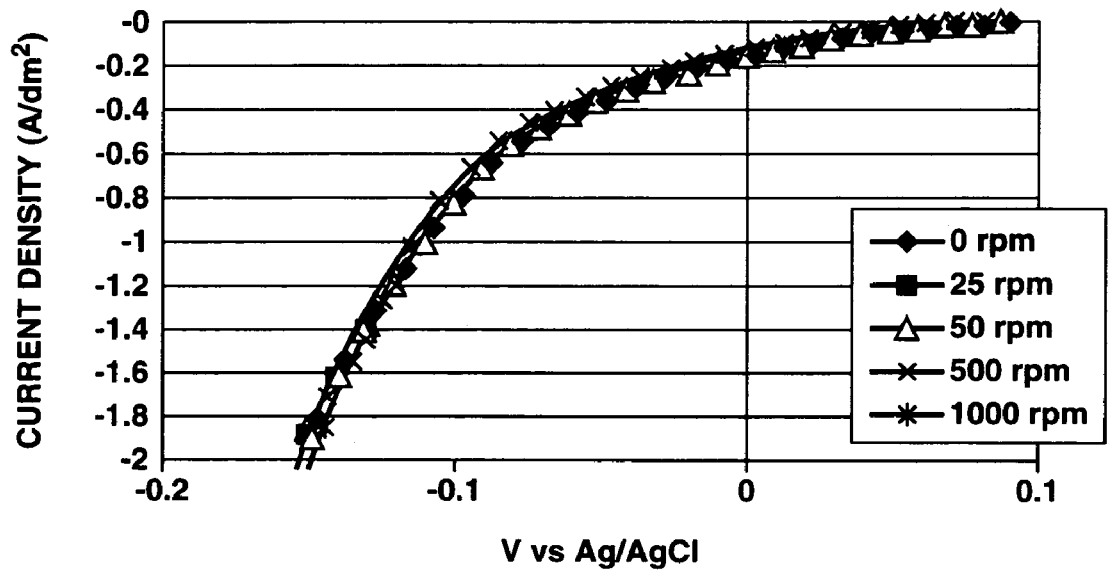
FIG. 10 shows polarization curves obtained by the polarization measurement for an electrolytic plating bath of Comparative Example 3.
Figure 11:
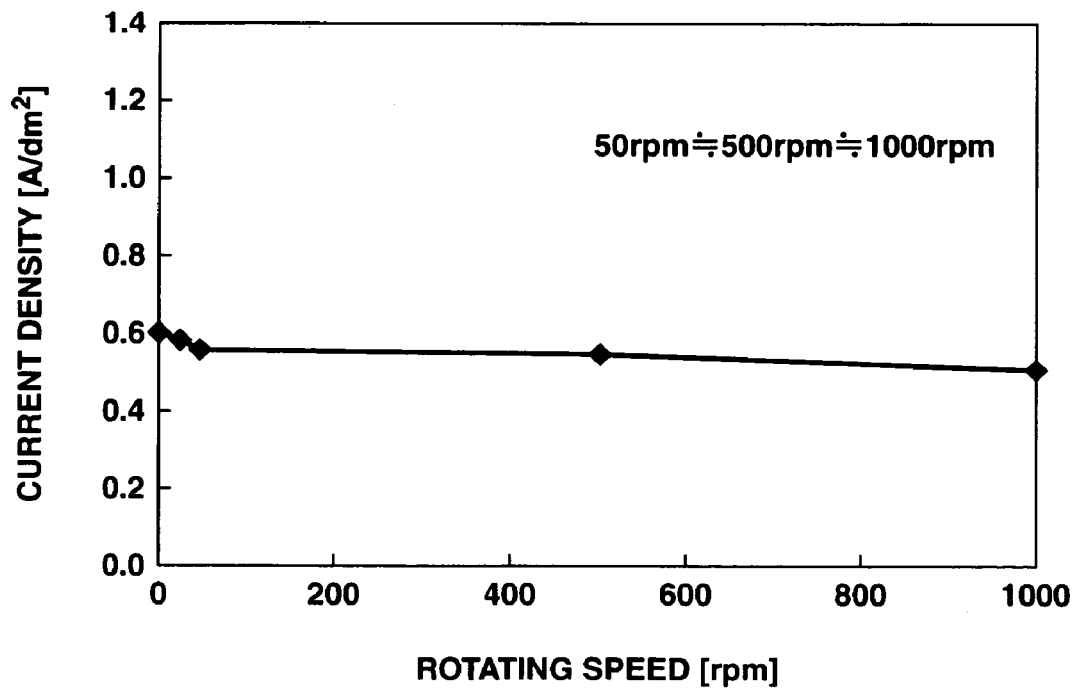
FIG. 11 shows a graph obtained by plotting the current density at a potential of –0.080 V, in the polarization curves at each rotating speeds shown in FIG. 10.
Figure 12:
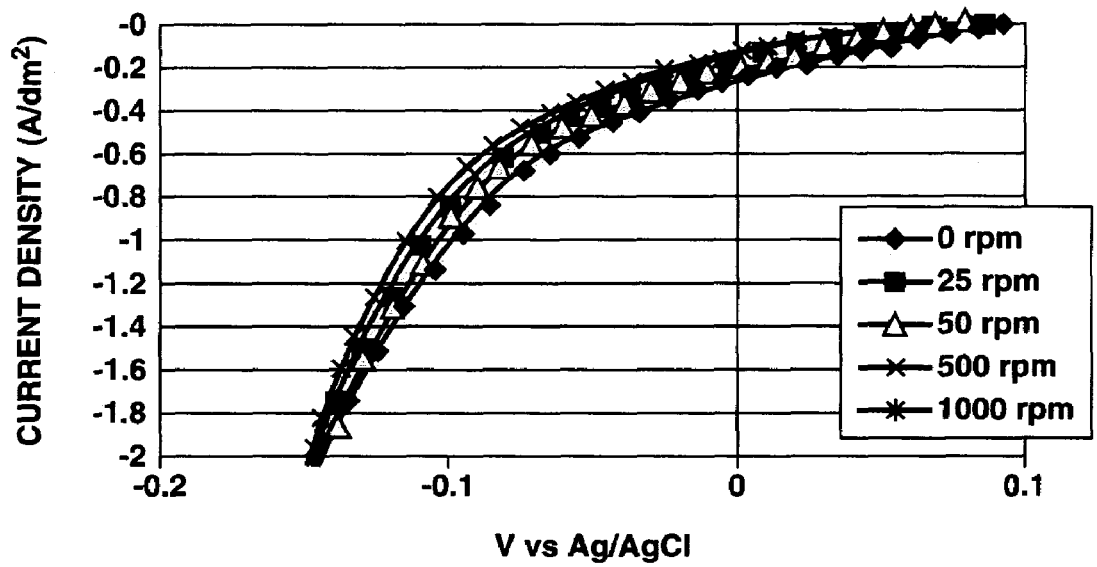
FIG. 12 shows polarization curves obtained by the polarization measurement for an electrolytic plating bath of Example 1.
Figure 13:
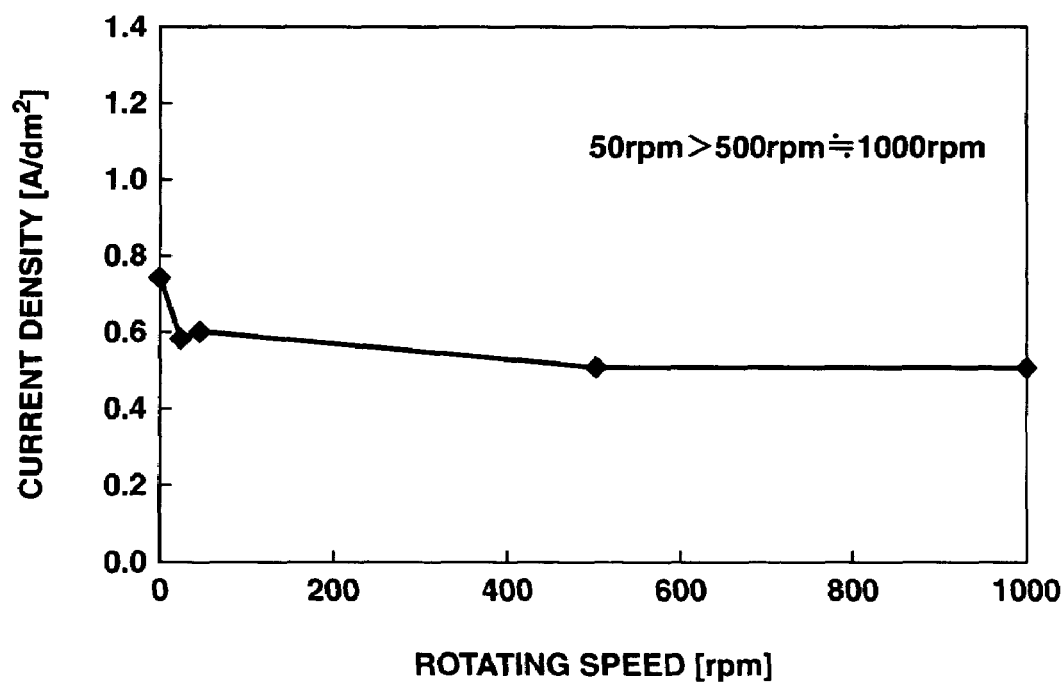
FIG. 13 shows a graph obtained by plotting the current density at a potential of –0.080 V, in the polarization curves at each rotating speeds shown in FIG. 12.
Figure 14:
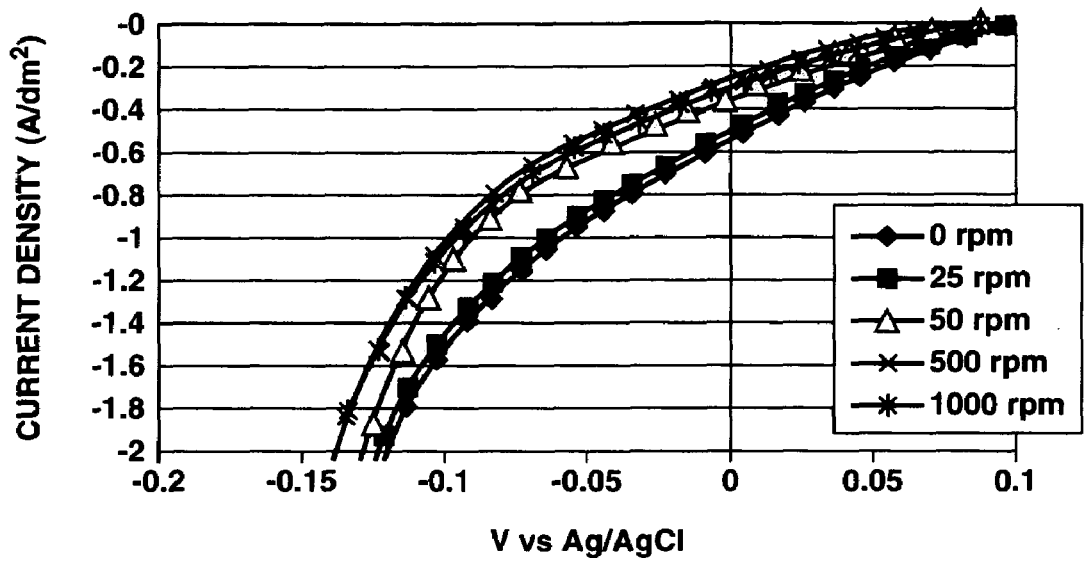
FIG. 14 shows polarization curves obtained by the polarization measurement for an electrolytic plating bath of Example 3.
Figure 15:
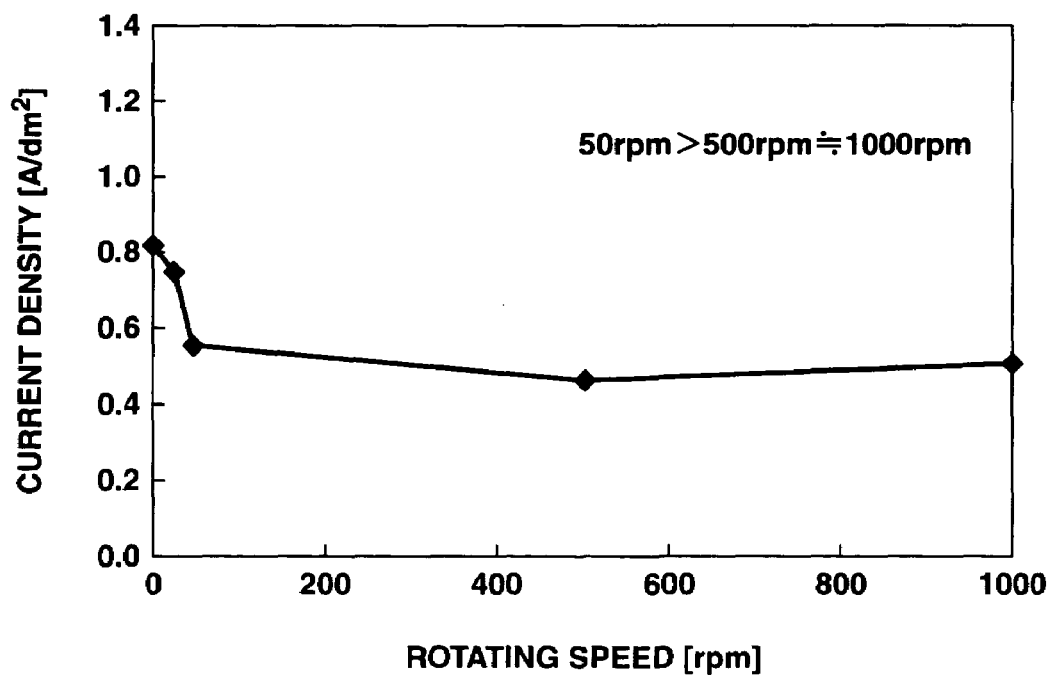
FIG. 15 shows a graph obtained by plotting the current density at a potential of –0.035 V, in the polarization curves at each rotating speeds shown in FIG. 14.
Figure 16:
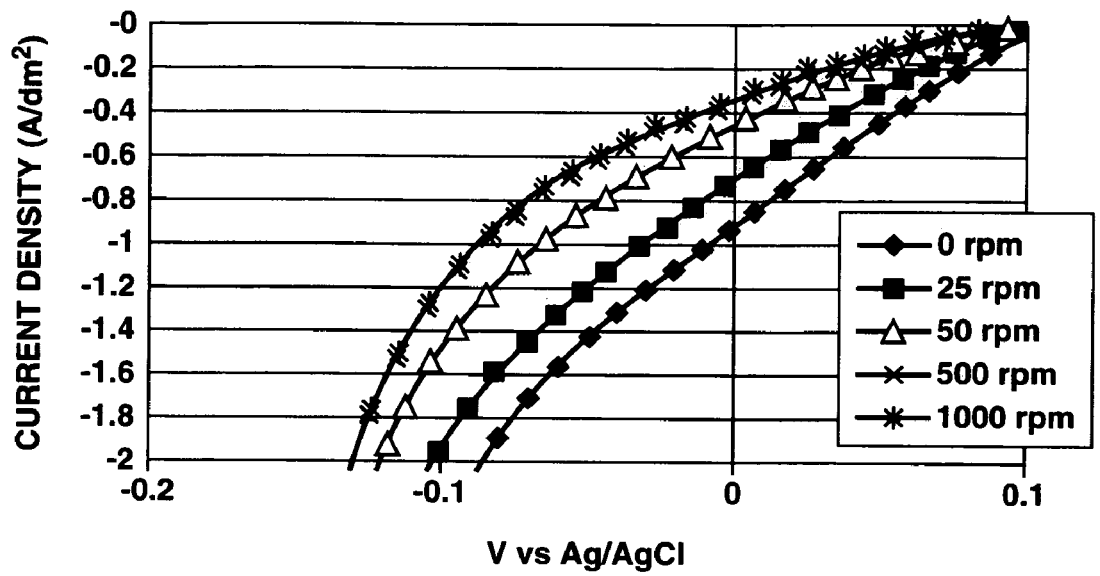
FIG. 16 shows polarization curves obtained by the polarization measurement for an electrolytic plating bath of Example 5.
Figure 17:
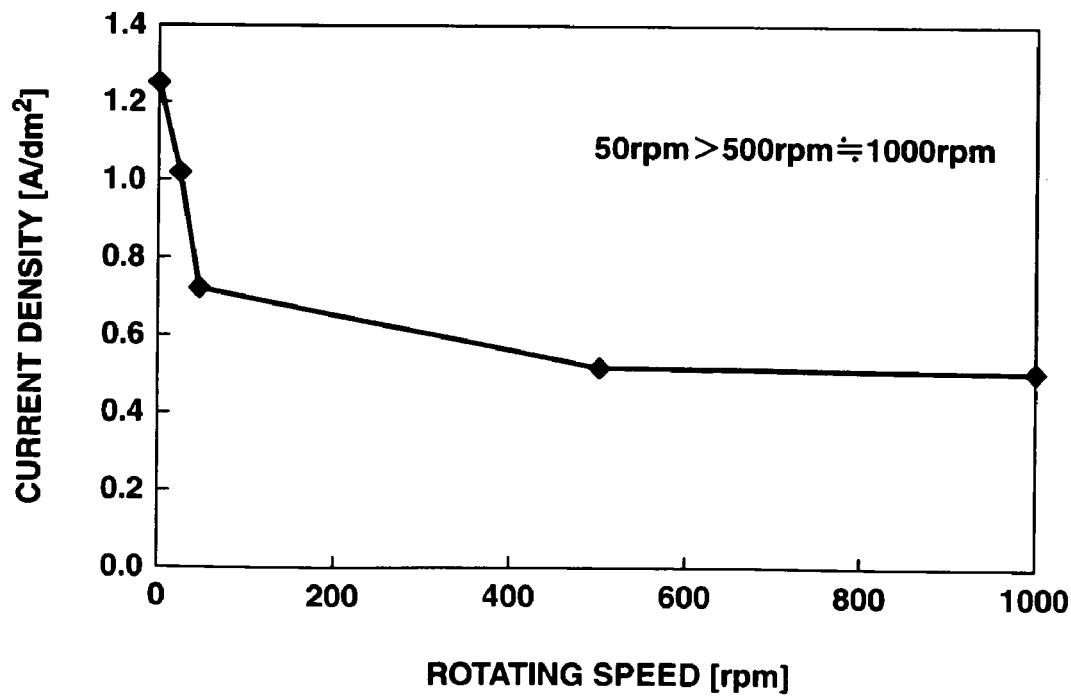
FIG. 17 shows a graph obtained by plotting the current density at a potential of –0.035 V, in the polarization curves at each rotating speeds shown in FIG. 16.

The potential at which the current density became 0.5 A/dm$^2$ was read from the polarization curve at a rotating speed of 1000 rpm, and the current densities at rotating speeds of 0, 25, 50 and 500 rpm at that potential were read from the polarization curve. The results are shown in Table 2. Besides, the polarization curves and the graphs obtained by plotting the current density at the potential at which the current density became 0.5 A/dm$^2$ (also given in Table 2) read from the polarization curves against the rotating speed are shown in FIGS. 6 and 7 (Comparative Example 1), FIGS. 8 and 9 (Comparative Example 4), FIGS. 10 and 11 (Comparative Example 3), FIGS. 12 and 13 (Example 1), FIGS. 14 and 15 (Example 3), and FIGS. 16 and 17 (Example 5).

TABLE 2

| | Comparative Example | | | Example | | |
|---|---|---|---|---|---|---|
| | 1 | 4 | 3 | 1 | 3 | 5 |
| Potential (V) | −0.050 | −0.028 | −0.080 | −0.080 | −0.035 | −0.035 |
| Rotating speed (rpm) | Current density (A/dm$^2$) | | | | | |
| 0 | 1.05 | 1.25 | 0.59 | 0.74 | 0.82 | 1.25 |
| 25 | 1.02 | 1.25 | 0.57 | 0.59 | 0.75 | 1.02 |
| 50 | 0.72 | 1.10 | 0.55 | 0.60 | 0.55 | 0.72 |
| 500 | 0.70 | 0.85 | 0.54 | 0.50 | 0.47 | 0.52 |
| 1000 | 0.50 | 0.50 | 0.50 | 0.50 | 0.50 | 0.50 |

In the case of Comparative Example 1, the relationship between the current densities at the different rotating speeds is in the manner of 50 rpm≧500 rpm>1000 rpm; thus, the difference in current density is large in a high rotating speed region, and is small in medium and low rotating speed regions. This means that since the diffusion rate of the leveler is too low, the plating-suppression is effective in the high rotating speed region (the diffusion layer is thin) but is not so effective in the medium to low rotating speed regions (the diffusion layer is medium to thick). When the diffusion rate is too low, the supply of the leveler is insufficient in the area ranging from an upper portion to an intermediate portion of the blind via-hole wall surface where the diffusion layer is not so thick, and the deposition in the area ranging from the upper portion to the intermediate portion of the blind via-hole wall surface cannot be suppressed. In addition, the supply of the leveler is little at the blind via-hole bottom portion, however, since the potential at the blind via-hole bottom is lower than that in the area ranging from the upper portion to the intermediate portion of the blind via-hole wall surface, plating from the bottom portion does not take place, and a large cavity as shown in FIG. 3A [Cavity 1] is generated.

In the case of Comparative Example 4, the relationship between the current densities at the different rotating speeds is in the manner of 50 rpm>500 rpm>1000 rpm; thus, the current density decreases linearly as the rotating speed is raised. The diffusion rate of the leveler in this case is slightly higher than that in Comparative Example 1, and the plating-suppression is effective also in the medium rotating speed region (the diffusion layer has a medium thickness). However, the difference in current density between the high rotating speed region and the medium rotating speed region is large, so that the diffusion rate of the leveler is not yet enough to fill up the high-aspect-ratio blind via-holes (the difference in diffusion layer thickness is large) without generation cavities (seams). When the leveler which is higher in diffusion rate than those in Comparative Examples 1 and 2 is used, the supply of the leveler to the upper portion of the blind via-hole wall surface is secured and the deposition on the upper portion is hence suppressed to a certain extent, but the supply of the leveler to the intermediate portion of the blind via-hole wall surface is small and the deposition on the intermediate portion cannot be suppressed. Since the potential at the blind via-hole bottom portion is lower than the potential at the intermediate portion of the blind via-hole wall surface, plating from the bottom portion does not take place, and a cavity as shown in FIG. 3B [Cavity 2] is generated.

In the case of Comparative Example 3, the relationship between the current densities at the different rotating speeds is in the manner of 50 rpm≈500 rpm≈1000 rpm; thus, there is little difference in current density between the high rotating speed region and the low rotating speed region. Hence, since the diffusion rate of the leveler is very high, the plating-suppression of the leveler is not liable to be influenced by the thickness of the diffusion layer, and there is little difference in the plating-suppression between different areas. Therefore, the plating-suppression is uniformly at the blind via-hole wall surface and the blind via-hole bottom portion, and the plating film is deposited along the shape of the blind via-hole, so that in the blind via-hole with a high aspect ratio, a cavity (seam) is generated at the blind via-hole central portion as shown in FIG. 3C [Cavity 3].

In comparison with these comparative examples, in the cases of Examples 1, 3 and 5, the current densities at the different rotating speeds are in the relationship of 50 rpm>500 rpm≈1000 rpm; thus, the difference in current density between 500 and 1000 rpm is smaller than those in Comparative Example 1 and Comparative Example 4, and the current density at 50 rpm is somewhat higher than those at 500 rpm and 1000 rpm, unlike in Comparative Example 3. The diffusion rate of the leveler is higher than those in Comparative Example 1 and Comparative Example 4, and is lower than that in Comparative Example 3. The leveler with such a diffusion rate shows a somewhat high diffusion rate even in the area ranging from an upper portion to an intermediate portion of the blind via-hole wall surface where the diffusion layer is somewhat thick, so that the leveler can be supplied to the area, and deposition in the area can be suppressed. In addition, the supply of the leveler is insufficient at the blind via-hole bottom portion where the diffusion layer is thicker than in the area ranging from the upper portion to the intermediate portion of the blind via-hole wall surface, so that the plating-suppression is weak and the plating film grows at a sufficient rate at the blind via-hole bottom portion. As a result, the blind via-holes are filled up without generation of cavities. The leveler having such a diffusion rate is a leveler suited to filling up blind via-holes having a high aspect ratio.

Comparative Example 6

A substrate (RCC substrate) provided with both blind via-holes having an aperture of 70 μmφ, a depth of 45 μm (copper layer portion 10 μm+resin layer portion 35 μm) and an aspect ratio of 0.64 and through-holes penetrating through the substrate in the thickness direction and having an aperture of 0.3 mmφ and a length of 0.6 mm was subjected to a desmear treatment, giving of a catalyst and a chemical copper plating (film thickness: about 0.5 μm) treatment by known methods. The substrate was electroplated by use of the electrolytic copper plating bath described in Comparative Example 1 under the conditions of CD=1.5 A/dm$^2$ and a plating time of 60 min.

Figure 18:
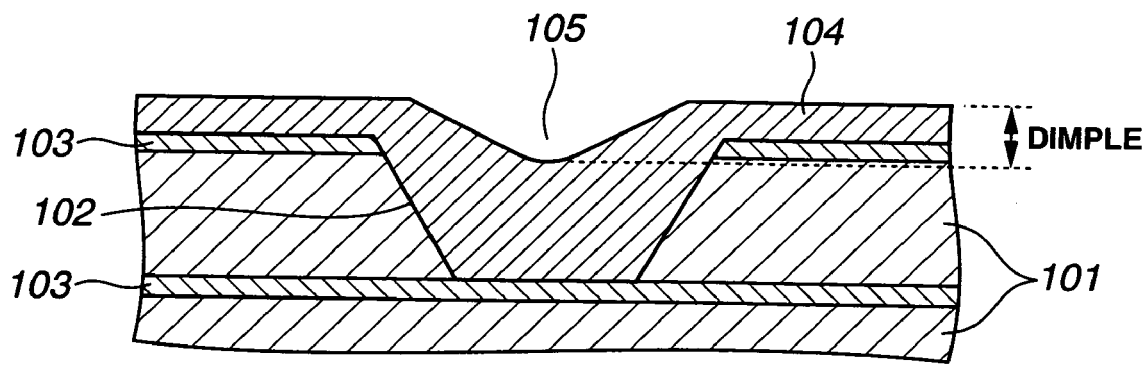
FIG. 18 is an illustration of the dimple on the upper side of the plating formed to fill a blind via-hole, measured in Comparative Examples 6 to 10 and Examples 7 to 12.

Next, for evaluating the plating-filled state of the blind via-hole, the blind via-hole was cut off, the section was polished to mirror surface, and the dimple in an upper portion of the plating film having filled up the blind via-hole was measured. Incidentally, the depth of the dimple is shown in FIG. 18, in which symbol 101 denotes a resin layer, 102 denotes a blind via-hole, 103 denotes a copper layer, 104 denotes copper (plating film), and 105 denotes a dimple. The results are given in Table 3.

Figure 19:
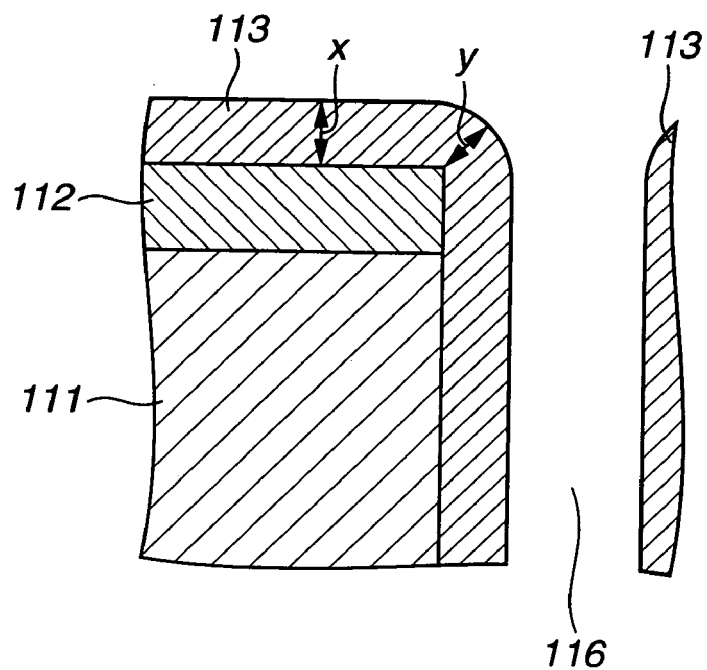
FIG. 19 is an illustration of the thickness x of a plating film formed on a substrate surface and the thickness y of a plating film formed on the upper end of a side surface of a through-hole, measured in Comparative Examples 6 to 10 and Examples 7 to 12.

In addition, for evaluating the plated state of the through-hole, a vertical section passing through the center of the aperture of the through-hole was cut off, the vertical section was polished to mirror surface, then the thickness x of the plating film formed on the substrate surface shown in FIG. 19 and the thickness (the thickness at a position of 135° relative to a through-hole side surface) y of the plating film formed at the through-hole side surface upper end (the substrate corner in the vertical section) were measured, and their ratio (y/x) was calculated. The results are also shown in Table 3. Incidentally, in FIG. 19, symbol 111 denotes a resin layer, 112 denotes a copper layer, 113 denotes copper (plating film), and 116 denotes a through-hole.

Comparative Example 7

A substrate (RCC substrate) provided with both blind via-holes having an aperture of 70 μmφ, a depth of 45 μm (copper layer portion 10 μm+resin layer portion 35 μm) and an aspect ratio of 0.64 and through-holes penetrating through the substrate in the thickness direction and having an aperture of 0.3 mmφ and a length of 0.6 mm was subjected to a desmear treatment, giving of a catalyst, and a chemical copper plating (film thickness: about 0.5 μm) treatment by known methods. The substrate was electroplated by use of the electrolytic copper plating bath described in Comparative Example 2 under the conditions of CD=1.5 A/dm² and a plating time of 60 min. Then, the plating-filled state of the blind via-holes and the plated state of the through-holes were evaluated by the same method as in Comparative Example 6. The results are shown in Table 3.

Comparative Example 8

A substrate (RCC substrate) provided with both blind via-holes having an aperture of 70 μmφ, a depth of 45 μm (copper layer portion 10 μm+resin layer portion 35 μm) and an aspect ratio of 0.64 and through-holes penetrating through the substrate in the thickness direction and having an aperture of 0.3 mmφ and a length of 0.6 mm was subjected to a desmear treatment, giving of a catalyst and a chemical copper plating (film thickness: about 0.5 μm) treatment by known methods. The substrate was electroplated by use of the electrolytic copper plating bath described in Comparative Example 3 under the conditions of CD=1.5 A/dm² and a plating time of 60 min. Then, the plating-filled state of the blind via-holes and the plated state of the through-holes were evaluated by the same method as in Comparative Example 6. The results are given in Table 3.

Comparative Example 9

A substrate (RCC substrate) provided with both blind via-holes having an aperture of 70 μmφ, a depth of 45 μm (copper layer portion 10 μm+resin layer portion 35 μm) and an aspect ratio of 0.64 and through-holes penetrating through the substrate in the thickness direction and having an aperture of 0.3 mmφ and a length of 0.6 mm was subjected to a desmear treatment, giving of a catalyst and a chemical copper plating (film thickness: about 0.5 μm) treatment by known methods. The substrate was electroplated by use of the electrolytic copper plating bath described in Comparative Example 4 under the conditions of CD=1.5 A/dm² and a plating time of 60 min. Then, the plating-filled state of the blind via-holes and the plated state of the through-holes were evaluated by the same method as in Comparative Example 6. The results are shown in Table 3.

Comparative Example 10

A substrate (RCC substrate) provided with both blind via-holes having an aperture of 70 μmφ, a depth of 45 μm (copper layer portion 10 μm+resin layer portion 35 μm) and an aspect ratio of 0.64 and through-holes penetrating through the substrate in the thickness direction and having an aperture of 0.3 mmφ and a length of 0.6 mm was subjected to a desmear treatment, giving of a catalyst and a chemical copper plating (film thickness: about 0.5 μm) treatment by known methods. The substrate was electroplated by use of the electrolytic copper plating bath described in Comparative Example 5 under the conditions of CD=1.5 A/dm² and a plating time of 60 min. Then, the plating-filled state of the blind via-holes and the plated state of the through-holes were evaluated by the same method as in Comparative Example 6. The results are given in Table 3.

Example 7

A substrate (RCC substrate) provided with both blind via-holes having an aperture of 70 μmφ, a depth of 45 μm (copper layer portion 10 μm+resin layer portion 35 μm) and an aspect ratio of 0.64 and through-holes penetrating through the substrate in the thickness direction and having an aperture of 0.3 mmφ and a length of 0.6 mm was subjected to a desmear treatment, giving of a catalyst and a chemical copper plating (film thickness: about 0.5 μm) treatment by known methods. The substrate was electroplated by use of an electrolytic copper plating bath described in Example 1 under the conditions of CD=1.5 A/dm² and a plating time of 60 min. Then, the plating-filled state of the blind via-holes and the plated state of the through-holes were evaluated by the same method as in Comparative Example 6. The results are shown in Table 3.

Example 8

A substrate (RCC substrate) provided with both blind via-holes having an aperture of 70 μmφ, a depth of 45 μm (copper layer portion 10 μm+resin layer portion 35 μm) and an aspect ratio of 0.64 and through-holes penetrating through the substrate in the thickness direction and having an aperture of 0.3 mmφ and a length of 0.6 mm was subjected to a desmear treatment, giving of a catalyst and a chemical copper plating (film thickness: about 0.5 μm) treatment by known methods. The substrate was electroplated by use of an electrolytic copper plating bath described in Example 2 under the conditions of CD=1.5 A/dm² and a plating time of 60 min. Then, the plating-filled state of the blind via-holes and the plated state of the through-holes were evaluated by the same method as in Comparative Example 6. The results are shown in Table 3.

Example 9

A substrate (RCC substrate) provided with both blind via-holes having an aperture of 70 μmφ, a depth of 45 μm (copper layer portion 10 μm+resin layer portion 35 μm) and an aspect ratio of 0.64 and through-holes penetrating through the substrate in the thickness direction and having an aperture of 0.3 mmφ and a length of 0.6 mm was subjected to a desmear treatment, giving of a catalyst and a chemical copper plating (film thickness: about 0.5 μm) treatment by known methods. The substrate was electroplated by use of an electrolytic copper plating bath described in Example 3 under the conditions of CD=1.5 A/dm² and a plating time of 60 min. Then, the plating-filled state of the blind via-holes and the plated state of the through-holes were evaluated by the same method as in Comparative Example 6. The results are shown in Table 3.

Example 10

A substrate (RCC substrate) provided with both blind via-holes having an aperture of 70 μmϕ, a depth of 45 μm (copper layer portion 10 μm+resin layer portion 35 μm) and an aspect ratio of 0.64 and through-holes penetrating through the substrate in the thickness direction and having an aperture of 0.3 mmϕ and a length of 0.6 mm was subjected to a desmear treatment, giving of a catalyst and a chemical copper plating (film thickness: about 0.5 μm) treatment by known methods. The substrate was electroplated by use of an electrolytic copper plating bath described in Example 4 under the conditions of CD=2 A/dm² and a plating time of 45 min. Then, the plating-filled state of the blind via-holes and the plated state of the through-holes were evaluated by the same method as in Comparative Example 6. The results are shown in Table 3.

Example 11

A substrate (RCC substrate) provided with both blind via-holes having an aperture of 70 μmϕ, a depth of 45 μm (copper layer portion 10 μm+resin layer portion 35 μm) and an aspect ratio of 0.64 and through-holes penetrating through the substrate in the thickness direction and having an aperture of 0.3 mmϕ and a length of 0.6 mm was subjected to a desmear treatment, giving of a catalyst and a chemical copper plating (film thickness: about 0.5 μm) treatment by known methods. The substrate was electroplated by use of an electrolytic copper plating bath described in Example 5 under the conditions of CD=3 A/dm² and a plating time of 30 min. Then, the plating-filled state of the blind via-holes and the plated state of the through-holes were evaluated by the same method as in Comparative Example 6. The results are shown in Table 3.

Example 12

A substrate (RCC substrate) provided with both blind via-holes having an aperture of 70 μmϕ, a depth of 45 μm (copper layer portion 10 μm+resin layer portion 35 μm) and an aspect ratio of 0.64 and through-holes penetrating through the substrate in the thickness direction and having an aperture of 0.3 mmϕ and a length of 0.6 mm was subjected to a desmear treatment, giving of a catalyst and a chemical copper plating (film thickness: about 0.5 μm) treatment by known methods. The substrate was electroplated by use of an electrolytic copper plating bath described in Example 6 under the conditions of CD=5 A/dm² and a plating time of 18 min. Then, the plating-filled state of the blind via-holes and the plated state of the through-holes were evaluated by the same method as in Comparative Example 6. The results are shown in Table 3.

TABLE 3

| | Results of evaluation | | |
|---|---|---|---|
| | Blind via-holes (70 μmϕ – d45 μm) | | Through-hole |
| | Cavity | Dimple (μm) | y/x |
| Comparative Example 6 | none | 2 | 0.10 |
| Comparative Example 7 | none | 3 | 0.22 |
| Comparative Example 8 | none | 40 | 0.90 |
| Comparative Example 9 | none | 3 | 0.47 |
| Comparative Example 10 | none | 4 | 0.45 |
| Example 7 | none | 2 | 0.88 |
| Example 8 | none | 5 | 0.82 |
| Example 9 | none | 4 | 0.85 |
| Example 10 | none | 3 | 0.75 |
| Example 11 | none | 5 | 0.68 |
| Example 12 | none | 7 | 0.72 |

In this case, the plating of blind via-holes could be achieved without generating any cavity in all the comparative examples and the examples; however, in Comparative Example 8, the dimple was large, and the blind via-hole was not filled up but plated with plating metal along the shape of the blind via-hole. The plating film at the through-hole side surface upper end (the substrate corner portion in the vertical section shown in FIG. 19) was thick in Comparative Examples 6, 7, 9 and 10, and even the maximum thereof was as insufficient as not more than 50% based on the plating film thickness on the substrate surface. In contrast, in the examples, the blind via-holes could be filled up in the condition where the dimple is sufficiently small, the values of the plating film thickness at the through-hole side surface upper end (the substrate corner portion in the vertical section shown in FIG. 19) were at least 68% based on the plating film thickness on the substrate surface, and the plating film was formed substantially along the substrate shape.

What is claimed is:

1. An electrolytic copper plating bath used for via-filling plating for a blind via-hole formed on a substrate, comprising a water-soluble copper salt, sulfuric acid, chloride ions, and a leveler as an additive, wherein the leveler is either one or both of a quaternary polyvinylimidazolium compound represented by the following formula (1), and a copolymer, represented by the following formula (2), of a vinylpyrrolidone and a quaternary vinylimidazolium compound:

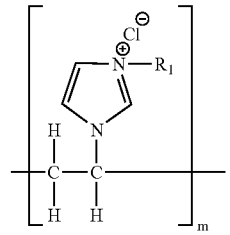
(1)

-continued

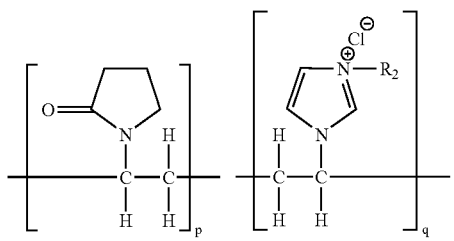

(2)

where $R_1$ and $R_2$ are each an alkyl group, m is an integer of not less than 2, and p and q are each an integer of not less than 1.

2. The electrolytic copper plating bath of claim 1, further comprising at least one brightener, at least one carrier, or at least one brightener and at least one carrier.

3. The electrolytic copper plating bath of claim 2,
wherein the bath comprises the at least one brightener and the at least one carrier,
wherein the at least one brightener is at least one additive comprising sulfur selected from the group consisting of formula (3), formula (4), formula (5), and formula (6):

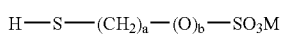

(3)

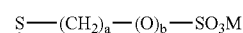

(4)

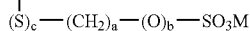

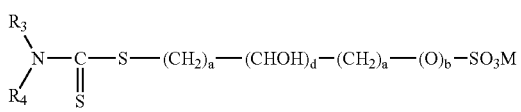

(5)

(6)

wherein $R_3$, $R_4$ and $R_5$ are each an alkyl group of 1 to 5 carbon atoms,
M is a hydrogen atom or an alkali metal,
a is an integer of 1 to 8, and b, c and d are each 0 or 1; and
wherein the at least one carrier is a polyalkylene glycol represented by the formula (7):

HO—($R_6$—O)$_e$—H (7)

wherein $R_6$ is an alkylene group of 2 or 3 carbon atoms, and e is an integer of not less than 4.

4. The electrolytic copper plating bath of claim 3, wherein the at least one carrier is a copolymer of ethylene glycol and propylene glycol.

5. The bath of claim 2, comprising the at least one brightener.

6. The bath of claim 2, comprising the at least one carrier.

7. The electrolytic copper plating bath of claim 1, wherein the blind via-hole on the substrate has a hole diameter of not less than 1 μm and an aspect ratio [(hole depth)/(hole diameter)] of not less than 2.

8. The electrolytic copper plating bath of claim 1, wherein the substrate comprising the blind via-hole further comprises a through-hole.

9. The electrolytic copper plating bath of claim 1, wherein $R_1$ and $R_2$ are each, independently, an alkyl group of 1 to 4 carbon atoms.

10. The bath of claim 1, comprising the leveler of formula (1).

11. The bath of claim 1, comprising the leveler of formula (2).

12. The bath of claim 1, comprising the leveler of formula (1) and the leveler of formula (2).

13. A copper electroplating process, comprising performing via-filling plating for a blind via-hole formed on a substrate by using an electrolytic copper plating bath comprising
a water-soluble copper salt,
sulfuric acid, chloride ions, and
a leveler as an additive, wherein the leveler is either one or both of a quaternary polyvinylimidazolium compound represented by the following formula (1), and a copolymer, represented by the following formula (2), of a vinylpyrrolidone and a quaternary vinylimidazolium compound:

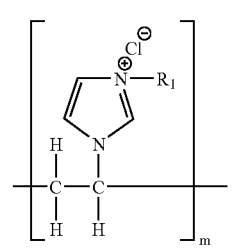

(1)

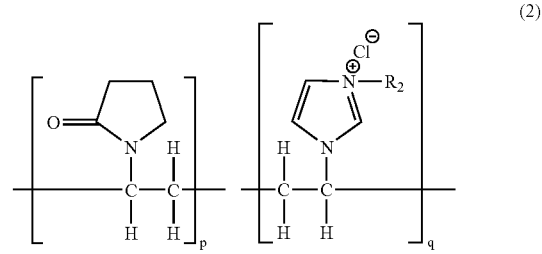

(2)

wherein $R_1$ and $R_2$ are each an alkyl group, m is an integer of not less than 2, and p and q are each an integer of not less than 1.

14. The copper electroplating process of claim 13, wherein said electrolytic copper plating bath further comprises at least one brightener, at least one carrier, or at least one brightener and at least one carrier.

15. The copper electroplating process of claim 13, wherein the blind via-hole has a diameter of not less than 1 μm and an aspect ratio [(hole depth)/(hole diameter)] of not less than 2.

16. The copper electroplating process of claim 13, wherein the substrate further comprises a through-hole.

17. The process of claim 13, wherein $R_1$ and $R_2$ are each, independently, an alkyl group of 1 to 4 carbon atoms.

18. The process of claim 13, comprising the leveler of formula (1).

19. The process of claim 13, comprising the leveler of formula (2).

20. The process of claim 13, comprising the leveler of formula (2) and the leveler of formula (1).

* * * * *